United States Patent
Ishida et al.

(10) Patent No.: US 8,624,127 B2
(45) Date of Patent: Jan. 7, 2014

(54) WIRING BOARD AND METHOD FOR MANUFACTURING THE SAME

(75) Inventors: Atsushi Ishida, Ogaki (JP); Ryojiro Tominaga, Ogaki (JP); Kenji Sakai, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 381 days.

(21) Appl. No.: 12/952,864

(22) Filed: Nov. 23, 2010

(65) Prior Publication Data

US 2011/0209904 A1   Sep. 1, 2011

Related U.S. Application Data

(60) Provisional application No. 61/308,627, filed on Feb. 26, 2010.

(51) Int. Cl.
*H05K 1/09* (2006.01)

(52) U.S. Cl.
USPC ............ 174/257; 174/262; 174/284; 174/285

(58) Field of Classification Search
USPC .................................. 174/257, 262, 264, 265
See application file for complete search history.

(56) References Cited

U.S. PATENT DOCUMENTS

| | | | |
|---|---|---|---|
| 5,949,030 A * | 9/1999 | Fasano et al. | 174/262 |
| 2009/0000812 A1 * | 1/2009 | Kariya | 174/260 |

FOREIGN PATENT DOCUMENTS

JP   2002-204075   7/2002

OTHER PUBLICATIONS

U.S. Appl. No. 12/857,838, filed Aug. 17, 2010, Ishida, et al.
U.S. Appl. No. 12/956,826, filed Nov. 30, 2010, Ishida, et al.
U.S. Appl. No. 12/956,753, filed Nov. 30, 2010, Morita, et al.

* cited by examiner

*Primary Examiner* — Timothy Thompson
*Assistant Examiner* — Andargie M Aychillhum
(74) *Attorney, Agent, or Firm* — Oblon, Spivak, McClelland, Maier & Neustadt, L.L.P.

(57) ABSTRACT

A wiring board includes a substrate having first and second surfaces and a first penetrating hole through the substrate, a first conductive circuit on the first surface of the substrate, a second conductive circuit on the second surface of the substrate, an interlayer insulation layer on the substrate and the first or second circuit, and a third conductive circuit on the interlayer layer. The interlayer layer has a via conductor in the interlayer layer and connecting the third circuit and the second conductor. The substrate has a first through-hole conductor connecting the first and second circuits and on the inner wall of the first hole, a filler filled inside the first conductor and forming a second penetrating hole, and a second through-hole conductor in the second hole. The via conductor is shifted from the center of the second conductor in the direction parallel to the first surface of the substrate.

20 Claims, 17 Drawing Sheets

FIG. 3
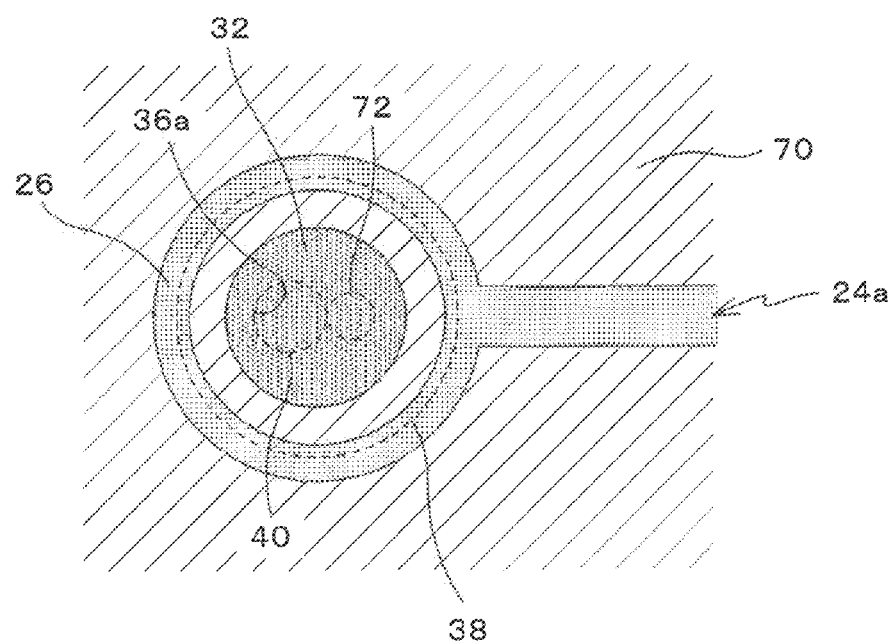
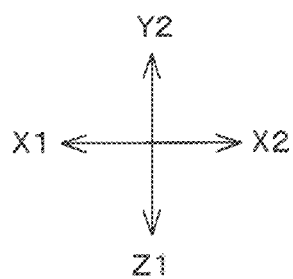

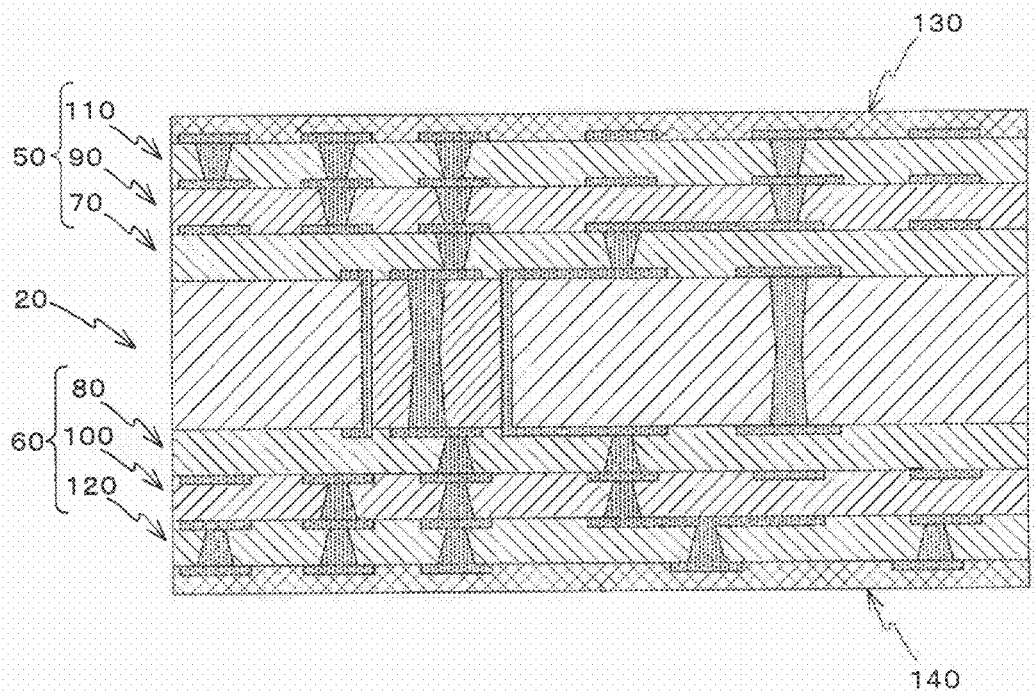
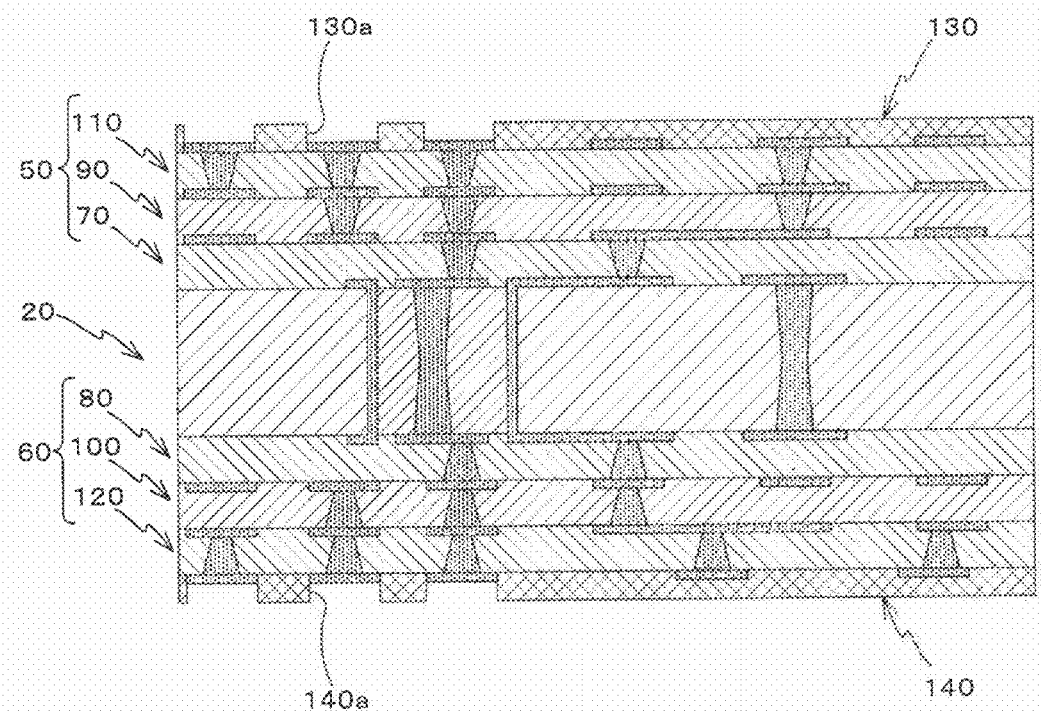

WIRING BOARD AND METHOD FOR MANUFACTURING THE SAME

CROSS-REFERENCE TO RELATED APPLICATIONS

The present application claims the benefits of priority to U.S. Application No. 61/308,627, filed Feb. 26, 2010. The contents of that application are incorporated herein by reference in their entirety.

BACKGROUND OF THE INVENTION

1. Field of the Invention

The present invention relates to a wiring board and its manufacturing method.

2. Discussion of the Background

A processing element such as a CPU (Central Processing Unit) or an MPU (Micro Processing Unit), and a VRM (Voltage Regulator Module) to supply power for such a processing element are mounted on a wiring board to be used as a computer motherboard, for example. A VRM works as a direct-current power source. Therefore, the output voltage phase and the output current phase of a VRM usually correspond to each other. However, under circumstances such as shortly after a processing element has started operations or at a sudden increase in the load intensity of a processing element, the output current phase is delayed relative to the output voltage phase due to the impedance of a transmission line that connects the processing element and the VRM. In such a case, the power supply for the processing element may be delayed.

Also, the electric current flowing through a transmission line that connects a VRM and a processing element generates a magnetic field with the transmission line as its center. Therefore, if the volume of the electric current flowing through the transmission line changes, a subsequent change in the magnetic field may cause noise in a signal line formed in the wiring board.

In Japanese Patent Publication No. 2002-204075, a wiring board having a center conductor and a ring conductor that surrounds the center conductor is described. The contents of Japanese Laid-Open Patent Application No. 2002-204075 are incorporated herein by reference in their entirety in the present application.

SUMMARY OF THE INVENTION

According to one aspect of the present invention, a wiring board includes a substrate having a first surface and a second surface on the opposite side of the first surface, the substrate having a first penetrating hole penetrating through the substrate between the first surface and the second surface, a first conductive circuit formed on the first surface of the substrate, a second conductive circuit formed on the second surface of the substrate, an interlayer insulation layer formed on the substrate and the first conductive circuit or the second conductive circuit, and a third conductive circuit formed on the interlayer insulation layer. The substrate has a first through-hole conductor connecting the first conductive circuit and the second conductive circuit and formed on the inner wall of the first penetrating hole, a filler filled inside the first through-hole conductor and forming a second penetrating hole, and a second through-hole conductor formed in the second penetrating hole. The second through-hole conductor has a conductive material filled in the second penetrating hole. The interlayer insulation layer has a via conductor formed in the interlayer insulation layer and electrically connecting the third conductive circuit and the second through-hole conductor. The via conductor is positioned such that the via conductor is shifted from the center of the second through-hole conductor in the direction parallel to the first surface of the substrate.

According to another aspect of the present invention, a method for manufacturing a wiring board includes forming a first penetrating hole in a substrate such that the first penetrating hole penetrates through the substrate between a first surface of the substrate and a second surface of the substrate on the opposite side of the first substrate, forming a first through-hole conductor on the inner wall of the first penetrating hole of the substrate, forming a first conductive circuit on the first surface, forming a second conductive circuit on the second surface of the substrate connected to the first conductive circuit by the first through-hole conductor, filling a filler inside the first through-hole conductor, forming a second penetrating hole in the filler, forming a second through-hole conductor by filling a conductive material in the second penetrating hole, forming an interlayer insulation layer on the substrate and the first conductive circuit or the second conductive circuit, forming a third conductive circuit on the interlayer insulation layer, and forming at a position shifted from the center of the second through-hole conductor in the direction parallel to the first surface of the substrate a via conductor in the interlayer insulation layer such that the second through-hole conductor and the third conductive circuit are connected by the via conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 is a cross-sectional view seen from the A-A line in FIG. 2;

FIGS. 7A-7B are views showing steps for forming solder-resist layers;

DETAILED DESCRIPTION OF THE EMBODIMENTS

Figure 1:
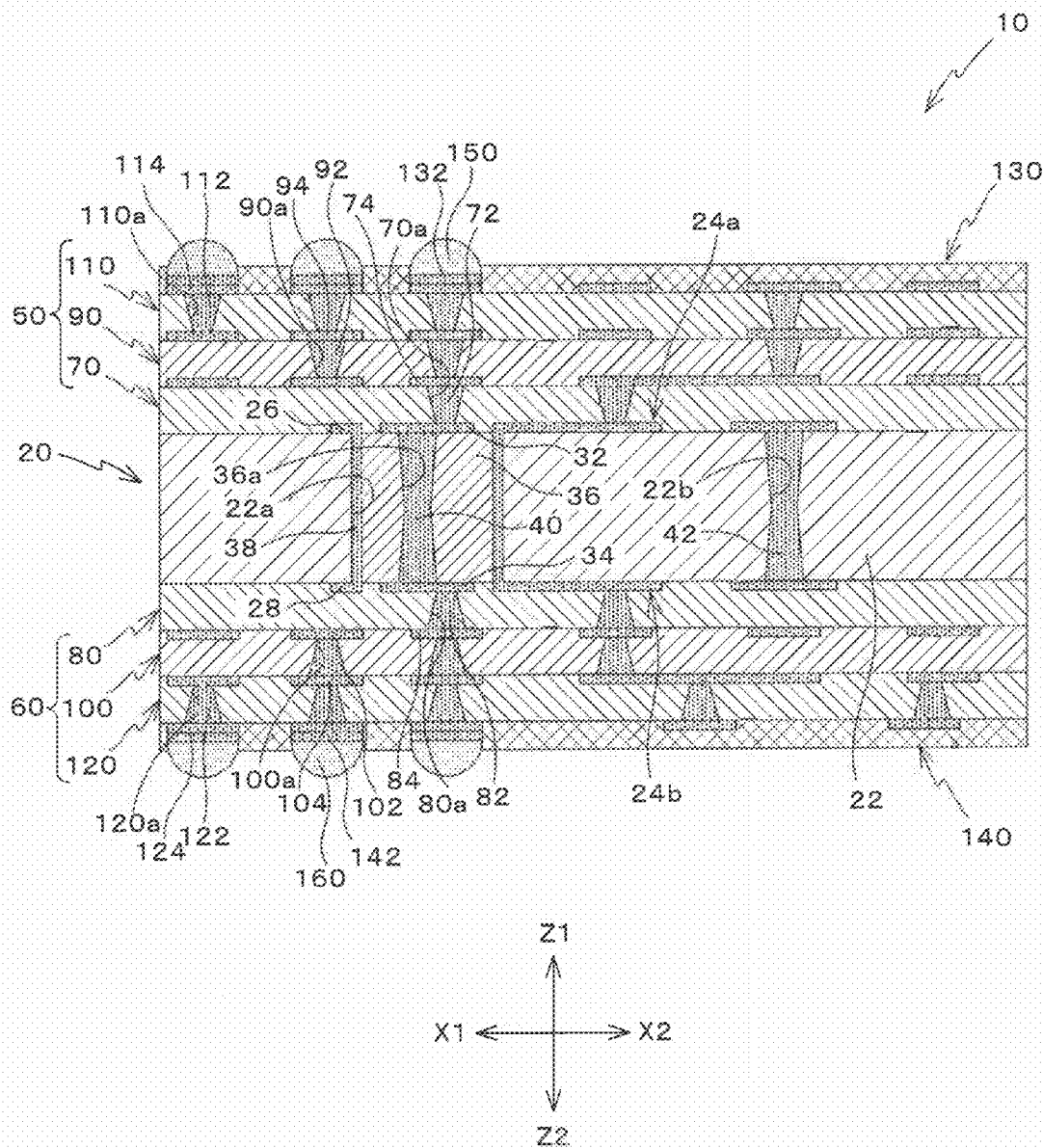
FIG. 1 is a cross-sectional view showing a wiring board according to an embodiment of the present invention.

The embodiments will now be described with reference to the accompanying drawings, wherein like reference numerals designate corresponding or identical elements throughout the various drawings.

As shown in FIG. 1, wiring board 10 according to the present embodiment has core substrate 20, built-up layers (50, 60), solder-resist layers (130, 140) and external connection terminals (150, 160).

Figure 2:
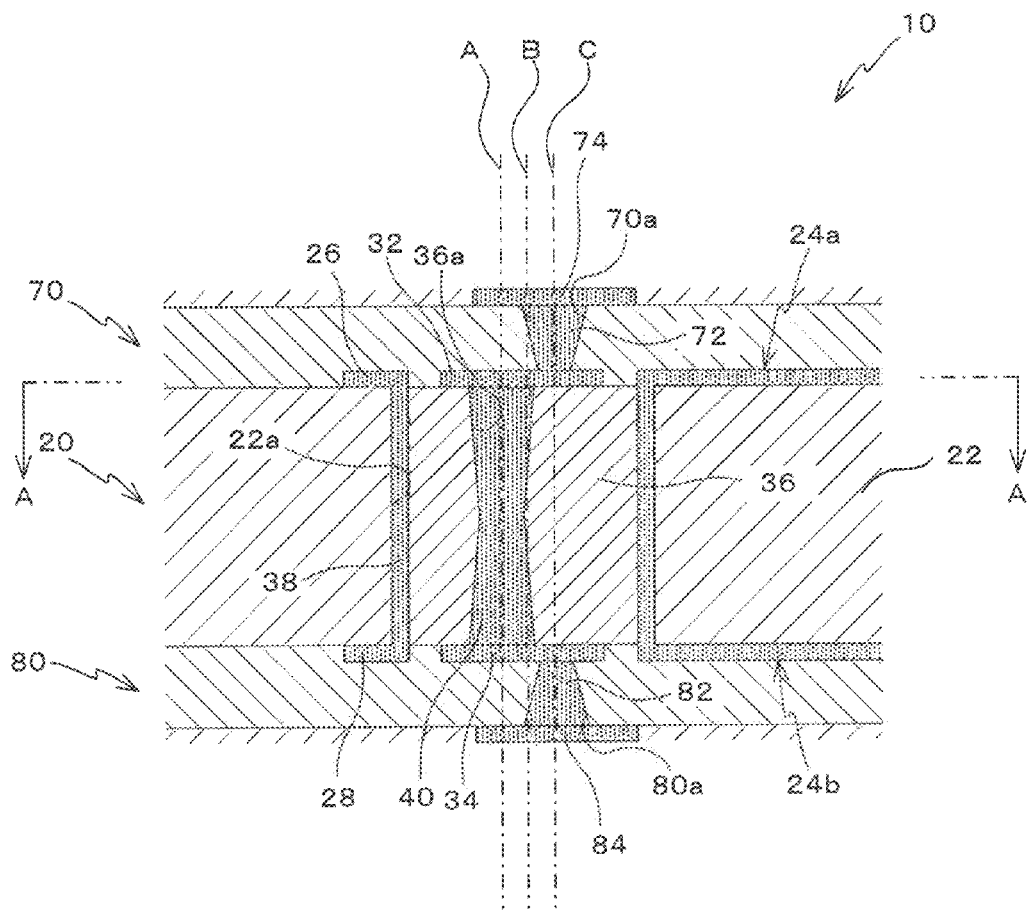
FIG. 2 is a cross-sectional view showing a core substrate of the wiring board.

As shown in FIG. 2, core substrate 20 has substrate 22, wiring layers (24a, 24b) made of copper, for example, outer through-hole conductor 38, filler 36, and inner through-hole conductor 40. In addition, substrate 22 has a first surface (the surface on the arrow-Z1 side) and a second surface opposite the first surface (the surface on the arrow-Z2 side). Wiring layer (24a) is formed on the first surface of substrate 22 and wiring layer (24b) is formed on the second surface of substrate 22.

Substrate 22 is made of epoxy resin, for example. Epoxy resin is preferred to contain reinforcing material such as glass fiber (glass fabric or glass non-woven fabric, for example) or aramid fiber (aramid non-woven fabric, for example) impregnated with resin. The material of substrate 22 is not limited to any specific type. The reinforcing material has a smaller thermal expansion coefficient than the primary material (epoxy resin in the present embodiment).

In substrate 22, first penetrating hole (22a) is formed to penetrate from the first surface through the second surface. The opening shape of first penetrating hole (22a) is circular.

On the inner wall of first penetrating hole (22a), outer through-hole conductor 38 is formed. Outer through-hole conductor 38 is made of plating. Here, plating indicates depositing a layered conductor (such as metal) on a surface of metal or resin and the deposited conductor (such as a metal layer). Also, plating includes wet plating such as electrolytic plating and electroless plating along with dry plating such as PVD (Physical Vapor Deposition) and CVD (Chemical Vapor Deposition). Outer through-hole conductor 38 is preferred to be made of copper plating.

As shown in FIG. 3, wiring layer (24a) has first conductive circuit 26 and conductive portion 32. First conductive circuit 26 and conductive portion 32 are made of plating. First conductive circuit 26 and conductive portion 32 are positioned on the same plane. Namely, the surface of first conductive circuit 26 and the surface of conductive portion 32 are positioned on the same plane. In addition, the thickness of first conductive circuit 26 is set greater than the thickness of first conductive circuit 32.

In the same manner, wiring layer (24b) has second conductive circuit 28 and conductive portion 34. Second conductive circuit 28 and conductive portion 34 are made of plating. Second conductive circuit 28 and conductive portion 34 are positioned on the same plane. Namely, the surface of second conductive circuit 28 and the surface of conductive portion 34 are positioned on the same plane. In addition, the thickness of second conductive circuit 28 is set greater than the thickness of second conductive circuit 34.

As described above, if conductive circuits are made thicker relative to conductive portions, the rigidity of core substrate 20 is ensured. As a result, even if thermal history is produced while external connection terminals are formed, for example, core substrate 20 is effectively suppressed from warping.

First conductive circuit 26 and second conductive circuit 28 are positioned to face each other sandwiching substrate 22. First conductive circuit 26 is formed on the first surface of substrate 22 and second conductive circuit 28 is formed on the second surface of substrate 22. Then, first conductive circuit 26 and second conductive circuit 28 are connected by outer through-hole conductor 38.

Resin filler 36 is filled inside outer through-hole conductor 38. Also, the first surface (the surface on the arrow-Z1 side) of filler 36 and the second surface opposite the first surface (the surface on the arrow-Z2 side) are left exposed by outer through-hole conductor 38. In filler 36, second penetrating hole (36a) which penetrates from the first surface through the second surface is formed. The opening shape of second penetrating hole (36a) is circular.

Conductive material such as copper plating is filled in second penetrating hole (36a). Accordingly, inner through-hole conductor 40 is formed in second penetrating hole (36a). Inner through-hole conductor 40 is preferred to be formed substantially cylindrical where the diameter in the central portion is set smaller than the diameter in the upper and lower end portions. Here, the central portion of inner through-hole conductor 40 indicates the central portion of inner through-hole conductor 40 in substrate 22 seen in directions Z. In addition, inner through-hole conductor 40 is formed to be shifted from center "A" of first penetrating hole (22a) in a direction indicated by arrow-X1.

Conductive portion 32 and conductive portion 34 are circular lands. Conductive portion 32 is formed on the first surface of filler 36 and conductive portion 34 is formed on the second surface of filler 36. Conductive portion 32 and conductive portion 34 face each other sandwiching filler 36. Such conductive portions (32, 34) are formed to have a greater diameter than those in the upper and lower ends of inner through-hole conductor 40. Then, conductive portion 32 and conductive portion 34 are connected by inner through-hole conductor 40.

Outer through-hole conductor 38 and inner through-hole conductor 40 are used as transmission routes that connect a processing element and a VRM, for example. Namely, outer through-hole conductor 38 and inner through-hole conductor 40 work as power-supply conductors.

Figure 4A:
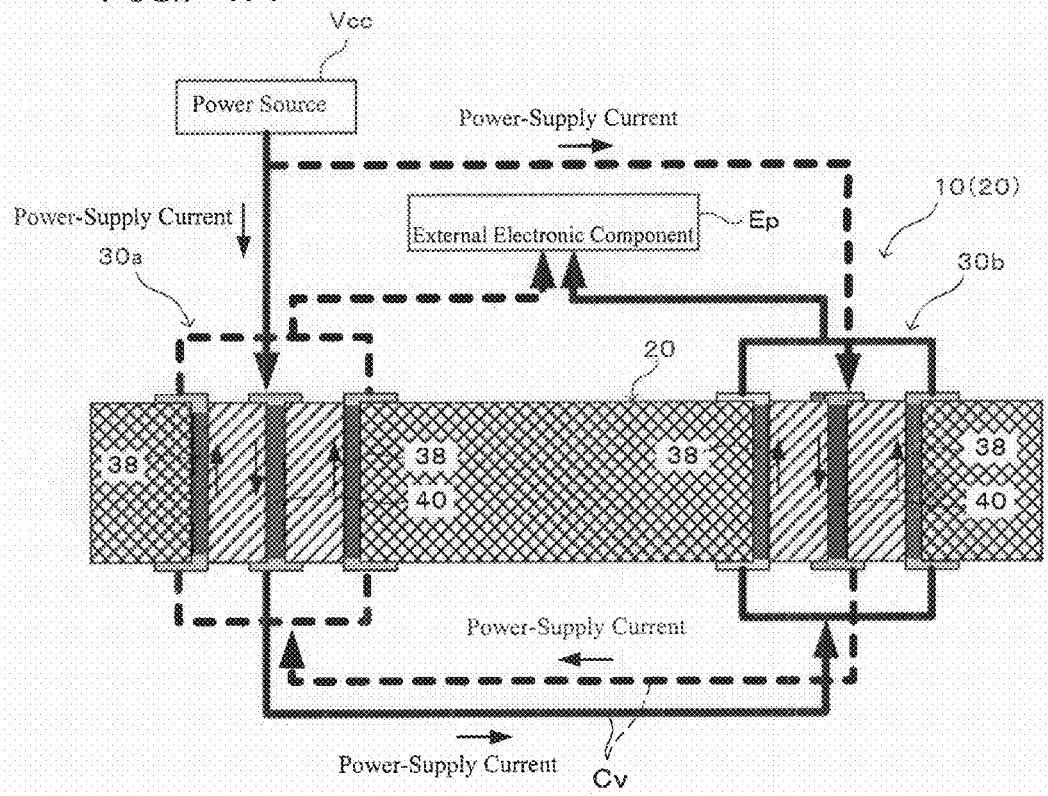
FIG. 4A is a view schematically showing electrical connections between two coaxial through-hole structures.

Here, as shown in FIG. 4A, in wiring board 10 (core substrate 20) of the present embodiment, first through-hole structure (30a) and second through-hole structure (30b) are formed to have a coaxial structure of outer through-hole conductor 38 and inner through-hole conductor 40. Then, outer through-hole conductor 38 of first through-hole structure (30a) is electrically connected to inner through-hole conductor 40 of second through-hole structure (30b). Moreover, inner through-hole conductor 40 of first through-hole structure (30a) is electrically connected to outer through-hole conductor 38 of second through-hole structure (30b). Accordingly, the direction of electric current flowing through outer through-hole conductor 38 is opposite the direction of electric current flowing through inner through-hole conductor 40.

Figure 4B:
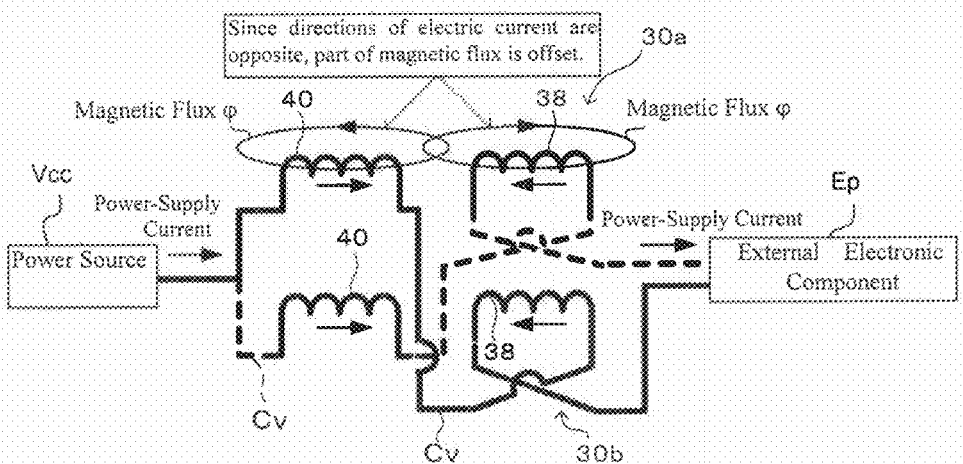
FIG. 4B is another view schematically showing electrical connections between two coaxial through-hole structures.

In the present embodiment, inductors are formed in outer through-hole conductor 38 and inner through-hole conductor 40 in first through-hole structure (30a) and second through-hole structure (30b) as shown in FIG. 4B. As shown in FIG. 4A, in first through-hole structure (30a) and second through-hole structure (30b), directions of electric current flowing through outer through-hole conductor 38 and inner through-hole conductor 40 are opposite each other, one in an upward direction when the other is in a downward direction. Thus, part of the magnetic flux (φ) generated in the inductors formed respectively in outer through-hole conductor 38 and inner through-hole conductor 40 is offset. Accordingly, impedance in transmission lines decreases in wiring board 10, and malfunctions and operational delays are suppressed from occurring in a CPU or an MPU. Furthermore, because of such structures, the flexibility of designing transmission lines in wiring board 10 or the flexibility of positioning an electronic component to be mounted on wiring board 10 increases. For example, a VRM for a constant voltage supply may be positioned near a CPU or an MPU.

In the present embodiment, by positioning a VRM near a CPU, for example, the supply of voltage from a point closer to a CPU is achieved without loss. Therefore, the number of chip capacitors to be set in a wiring board for power supply is reduced. In the present invention, VRM inductors are formed by connecting multiple through-hole structures. Thus, three-dimensional spiral inductors are formed in the wiring board. As a result, compared with situations in which inductors are formed using conductive circuits on an insulation layer, for example, an efficient use of space is achieved. Accordingly, the wiring board is suppressed from being enlarged.

Furthermore, as previously shown in FIG. 1, core substrate 20 has third through-hole conductor 42. Third through-hole conductor 42 is formed by filling plating in third penetrating hole (22b) formed in substrate 22. Also, third through-hole conductor 42 is formed to be substantially cylindrical having a smaller diameter in the central portion than the diameters in the upper and lower end portions, the same as in inner through-hole conductor 40.

Third through-hole conductor 42 connects first conductive circuit 26 and second conductive circuit 28. Then, third through-hole conductor 42 is used as a transmission route to transmit signals from, for example, an electronic component mounted on wiring board 10.

Built-up layer 50 is formed on the first surface of substrate 22 (the surface on the arrow-Z1 side), and built-up layer 60 is formed on the second surface of substrate 22 (the surface on the arrow-Z2 side). Built-up layer 50 has three insulation layers (70, 90, 110) made of the same material. Also, built-up layer 60 has three insulation layers (80, 100, 120) made of the same material.

As shown in FIG. 2, insulation layer 70 is formed on the first surface of substrate 22. Such insulation layer 70 is made of cured prepreg, for example. As for such a prepreg, for example, the following may be used: those made by impregnating a base material such as glass fiber or aramid fiber with a resin such as epoxy resin, polyester resin, bismaleimide-triazine resin (BT resin), imide resin (polyimide), phenol resin or allyl polyphenylene-ether resin (A-PPE resin). Instead of prepreg, liquid or film-type thermosetting resins, thermoplastic resins or compound resins of those, and even RCF (resin-coated copper foil) may be used.

Via hole (70a) is formed in insulation layer 70. Then, plating is filled in via hole (70a). The plating filled in via hole (70a) becomes via conductor 72. Also, third conductive circuit 74 is formed on insulation layer 70. Third conductive circuit 74 is connected to conductive portion 32 by via conductor 72.

Insulation layer 80 is formed on the second surface of substrate 22. Via hole (80a) is formed in insulation layer 80. Then, plating is filled in via hole (80a). The plating filled in via hole (80a) becomes via conductor 82. Also, fourth conductive circuit 84 is formed on insulation layer 80. Fourth conductive circuit 84 is connected to conductive portion 34 by via conductor 82.

Via conductors (72, 82) are positioned to be shifted from center "A" of inner through-hole conductor 40 in a direction indicated by arrow-X2. Namely, via conductors (72, 82) are shifted in a direction substantially perpendicular to the axis of inner through-hole conductor 40.

As previously shown in FIG. 1, insulation layer 90 and conductive circuit 94 are formed on the arrow-Z1 side of insulation layer 70. Conductive circuit 94 is connected to third conductive circuit 74 by via conductor 92 formed in via hole (90a) of insulation layer 90.

Insulation layer 100 and conductive circuit 104 are formed on the arrow-Z2 side of insulation layer 80. Conductive circuit 104 is connected to fourth conductive circuit 84 by via conductor 102 formed in via hole (100a) of insulation layer 100.

Insulation layer 110 and conductive circuit 114 are formed on the arrow-Z1 side of insulation layer 90. Conductive circuit 114 is connected to conductive circuit 94 by via conductor 112 formed in via hole (110a) of insulation layer 110.

Insulation layer 120 and conductive circuit 124 are formed on the arrow-Z2 side of insulation layer 100. Conductive circuit 124 is connected to conductive circuit 104 by via conductor 122 formed in via hole (120a) of insulation layer 120.

Solder-resist layer 130 is formed on the arrow-Z1 side of insulation layer 110. Also, solder-resist layer 140 is formed on the arrow-Z2 side of insulation layer 120. Solder-resist layers (130, 140) are made of a resin such as a photosensitive resin using acrylic-epoxy resin, a thermosetting resin mainly containing epoxy resin, or an ultraviolet setting resin.

In solder-resist layers (130, 140), openings partly exposing conductive circuits (114, 124) are formed. Such portions of conductive circuits (114, 124) are used for solder pads. Solder connection layers (132, 142) are formed to enhance solderability. Solder connection layers (132, 142) are plated layers to enhance solderability and are made of a nickel layer and a gold layer.

Then, external connection terminals (150, 160) are formed on solder connection layers (132, 142). External connection terminals (150, 160) are used for electrical connection with other wiring boards and electronic components, for example. Electronic components such as an IC are mounted on wiring board 10 if required.

Next, a method for manufacturing wiring board 10 is described by referring to FIGS. 5A through 8B.

Forming Core Substrate 20

Figure 5A:
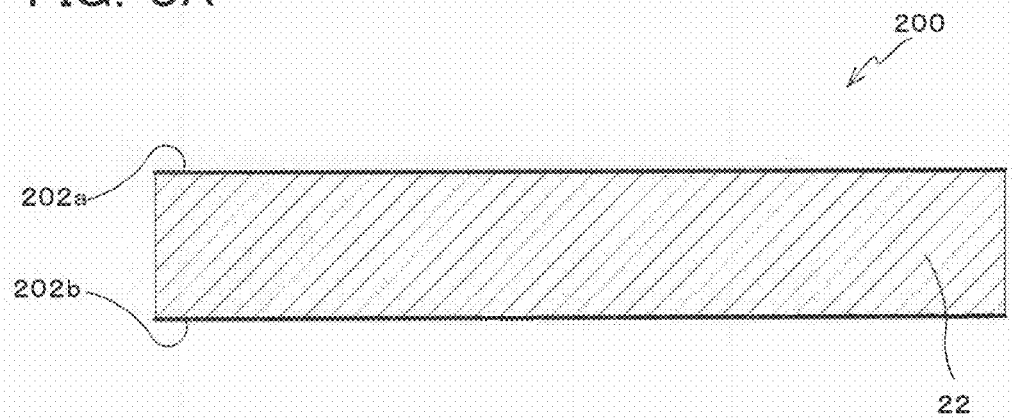
FIGS. 5A-5H are views showing steps for manufacturing a core substrate.

First, copper-clad laminate 200 shown in FIG. 5A is formed by laminating copper foils on the surfaces of substrate 22. Copper-clad laminate 200 is formed with substrate 22 and copper foils (202a, 202b). Copper foil (202a) is laminated on the first surface of substrate 22 and copper foil (202b) is laminated on the second surface of substrate 22.

Figure 5B:
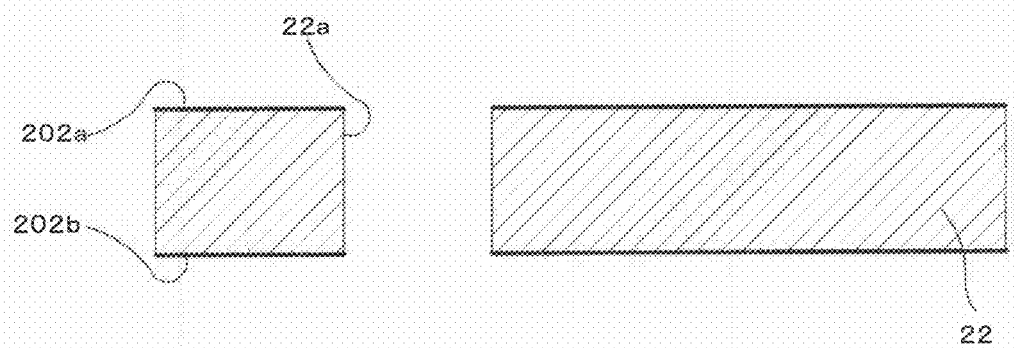

As shown in FIG. 5B, first penetrating hole (22a) is bored in copper-clad laminate 200 by a known method such as using a drill or the like. The opening shape of first penetrating hole (22a) is circular in the present embodiment. However, the opening shape is not limited to such, and it may be oval, for example.

Next, a palladium catalyst, for example, is prepared so that such a catalyst is adsorbed on the substrate surfaces including the inner wall of first penetrating hole (22a). Then, electroless plated films are formed by electroless plating on the substrate surfaces including the inner wall of first penetrating hole (22a).

The electroless plated films are made of copper, for example. However, such films are not limited to copper. As the material for electroless plated films, nickel, titanium, chrome or the like may also be used. Instead of electroless plated film, PVD film and CVD film may also be used. A catalyst is not required for forming PVD film or CVD film.

Figure 5C:
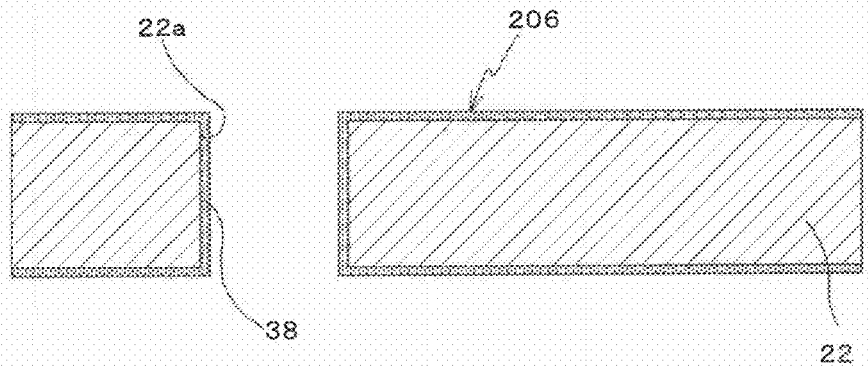

Next, as shown in FIG. 5C, electrolytic plated films 206 are formed by electrolytic plating using the electroless plated films as seed layers, for example. Electrolytic plated films 206 are made of copper, for example. However, the material for electrolytic plated films 206 is not limited to copper, and nickel, titanium, chrome or the like may also be used.

Outer through-hole conductor 38 is formed on the inner wall of first penetrating hole (22a) by performing electroless plating and electrolytic plating as above.

Figure 5D:
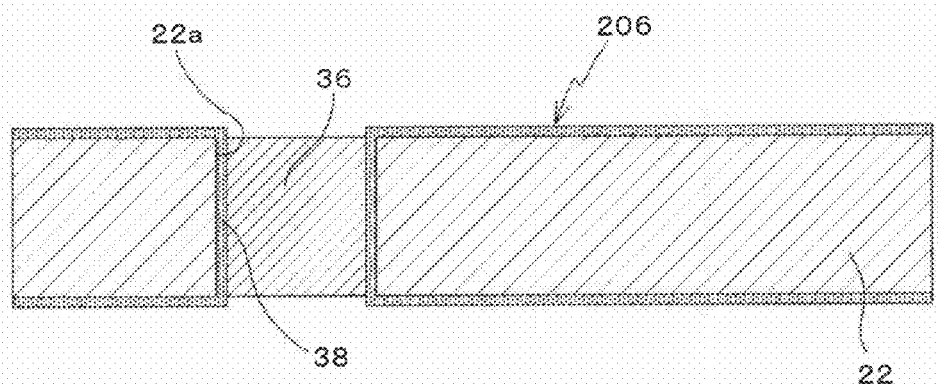

Next, as shown in FIG. 5D, filler 36 is filled in outer through-hole conductor 38, and dries filler 36 and cures it. As a filling method, a known method such as screen printing may be employed. During that time, as filler 36 settles, its surfaces tend to curve.

Figure 5E:
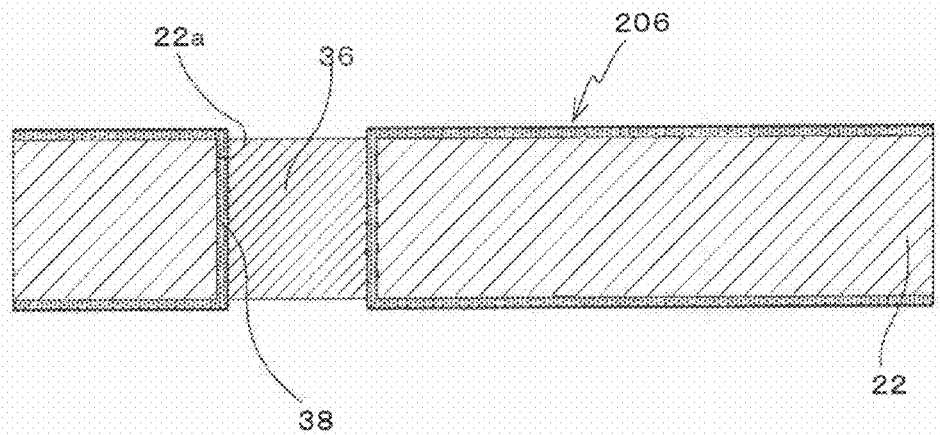

Next, as shown in FIG. 5E, a black-oxide treatment is performed. Accordingly, electrolytic plated films 206 become blackened, raising the absorption rate for laser beams which are used in a later-described laser processing.

Figure 5F:
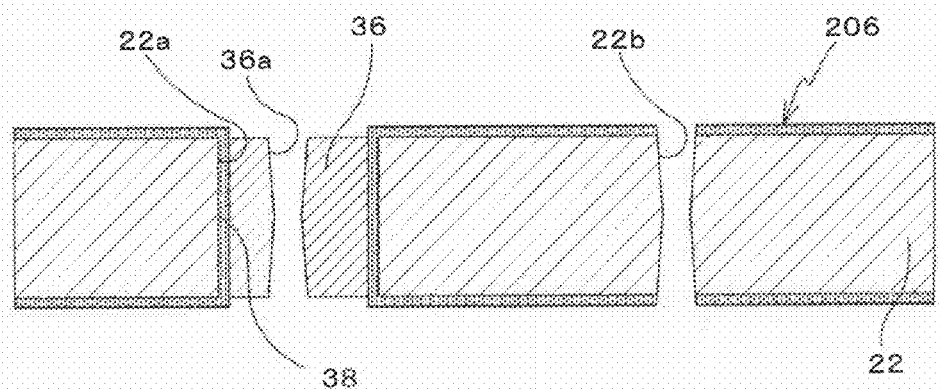

Next, as shown in FIG. 5F, second penetrating hole (36a) and third penetrating hole (22b) are formed by laser processing. The laser oscillation condition for forming second penetrating hole (36a) is preferred to be the same as the laser oscillation condition for forming third penetrating hole (22b). In doing so, the inner diameter is set the same in second penetrating hole (36a) and third penetrating hole (22b).

The laser to be used for such a laser processing is, for example, a carbon-dioxide gas ($CO_2$) laser, UV-YAG laser or the like. Laser beams having higher energy are irradiated in the center than on the periphery. Alternatively, laser beams having multiple pulses are irradiated. In such a case, it is preferred to reduce the laser diameter gradually from the first pulse toward the final pulse. In addition, a laser beam having higher energy density in the center than on the periphery may also be used for the final pulse.

Second penetrating hole (36a) and third penetrating hole (22b) are formed to be substantially cylindrical, having a smaller inner diameter in the central portion than in the upper and lower end portions.

In the present embodiment, second penetrating hole (36a) is formed so that the center of second penetrating hole (36a) is shifted from center "B" of first penetrating hole (22a) in a direction indicated by arrow-X1.

Figure 5G:
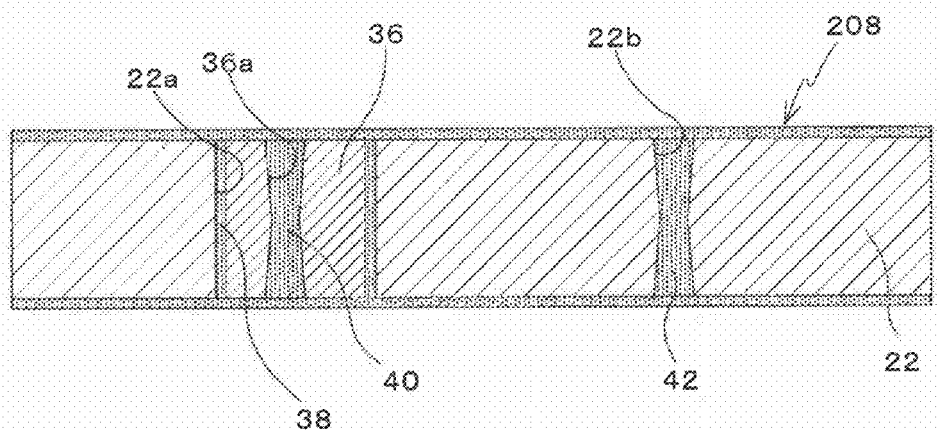

Next, as shown in FIG. 5G; plated films 208 are formed by electroless plating and electrolytic plating on the substrate surfaces including the inside of second penetrating hole (36a) and third penetrating hole (22b). During that time, conductive material made of plating is filled in second penetrating hole (36a) and third penetrating hole (22b), and inner through-hole conductor 40 and third through-hole conductor 42 are formed.

Second through-hole conductor 40 is formed so that the center "A" of second through-hole conductor 40 is shifted from center "B" of first penetrating hole (22a) in a direction indicated by arrow-X1.

Figure 5H:
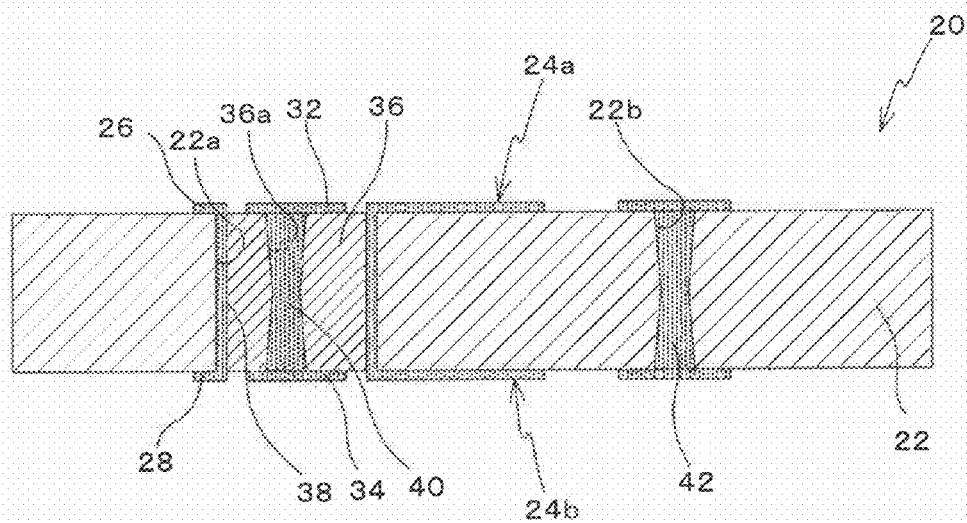

Next, plated films 208 are patterned using a tenting method. Then, as shown in FIG. 5H, first conductive circuit 26 and conductive portion 32 are formed simultaneously on the first surface of substrate 22. Also, second conductive circuit 28 and conductive portion 34 are formed simultaneously on the second surface of substrate 22.

After that, if required, the surfaces of wiring layers (24a, 24b) are roughened by etching, for example. Accordingly, adhesiveness with insulation layers (70, 80) to be formed as their upper layers is ensured. Core substrate 20 is obtained by the process described so far.

Forming Built-Up Layer 50 and Built-Up Layer 60

Figure 6A:
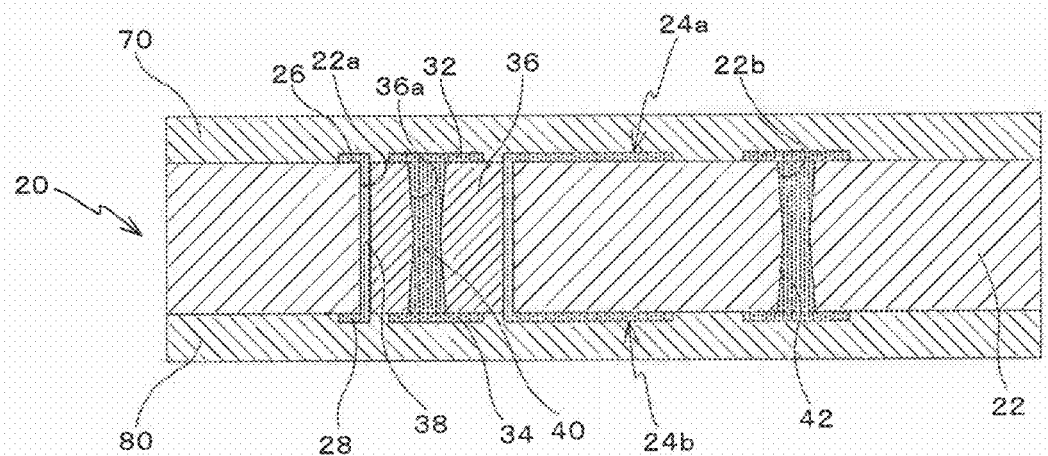
FIGS. 6A-6H are views showing steps for forming built-up layers.

Next, as shown in FIG. 6A, insulation layers (70, 80) are formed by placing film-type thermosetting resin on the first and second surfaces of substrate 22 and thermal pressing the films. Insulation layers (70, 80) may also be formed by coating liquid-type thermosetting resin using a screen printing method or curtain-coating method.

Figure 6B:
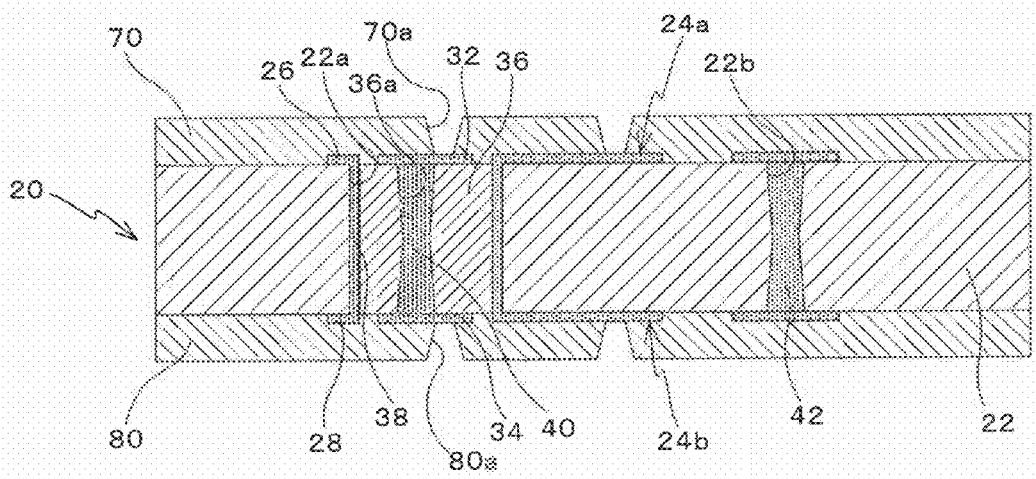

After insulation layers (70, 80) are formed, via holes (70a, 80a) are formed in insulation layers (70, 80) by laser processing as shown in FIG. 6B.

In the present embodiment, via hole (70a) is formed in a position that is shifted from center "A" of second through-hole conductor 40 in a direction indicated by arrow-X2. Also, via hole (80a) is formed in a position that is shifted from center "A" of second through-hole conductor 40 in a direction indicated by arrow-X2.

Next, a treatment (desmearing) is carried out to remove smears or the like remaining on the bottom portions of via holes (70a, 80a).

Next, as shown in FIGS. 6C through 6F, third conductive circuit 74 is formed in insulation layer 70 and fourth conductive circuit 84 is formed in insulation layer 80 using a semi-additive method.

Figure 6C:
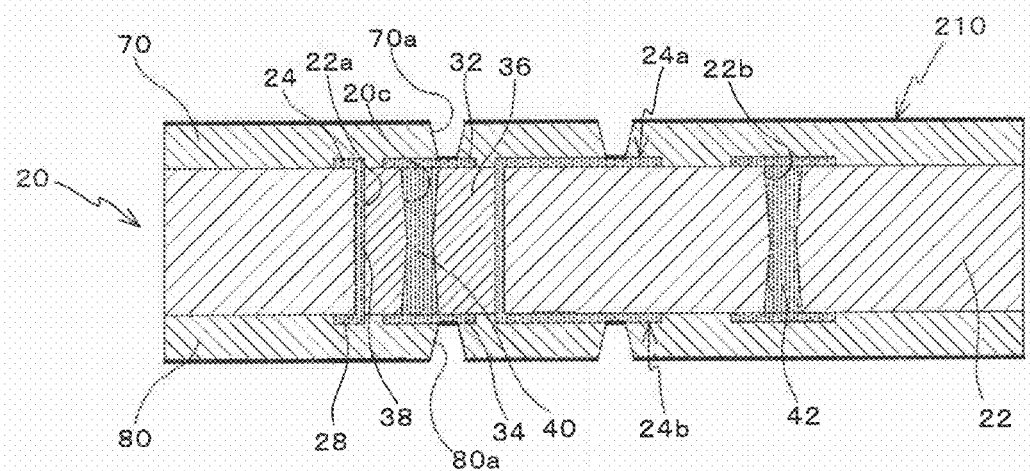

Specifically, first, the substrate shown in FIG. 6B is immersed in a catalyst solution containing palladium or the like. Then, by immersing the substrate having the adsorbed catalyst on the surfaces of insulation layers (70, 80) in an electroless copper plating solution, electroless plated films 210 are formed on the surfaces of insulation layers (70, 80) as shown in FIG. 6C.

Figure 6D:
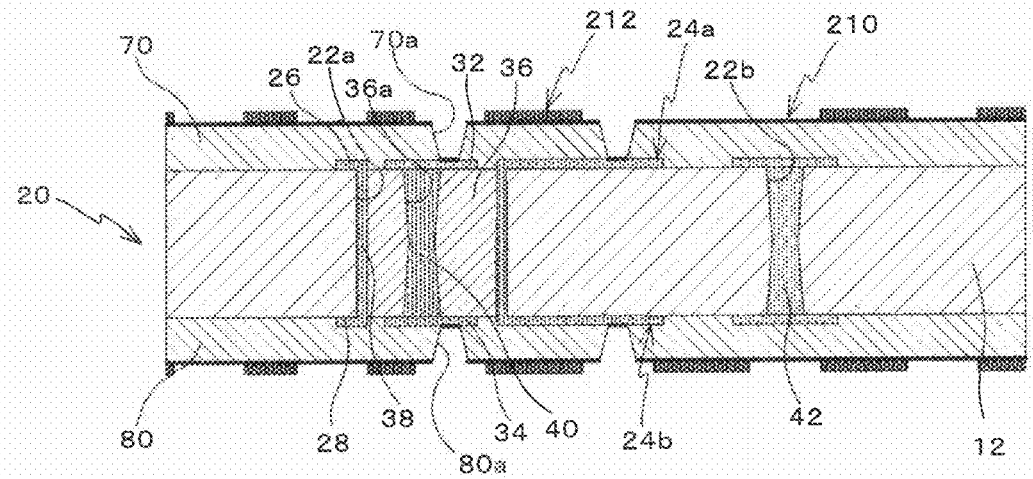

After electroless plated films 210 are formed, a dry-film photosensitive resist is laminated on both surfaces of the substrate. Then, a mask film with a predetermined pattern is adhered to the photosensitive resist, which is then exposed to ultraviolet rays and developed in an alkaline solution. As a result, as shown in FIG. 6D, plating resist layers 212 are formed having openings only in portions where third conductive circuit 74, fourth conductive circuit 84 and the like are formed later.

Figure 6E:
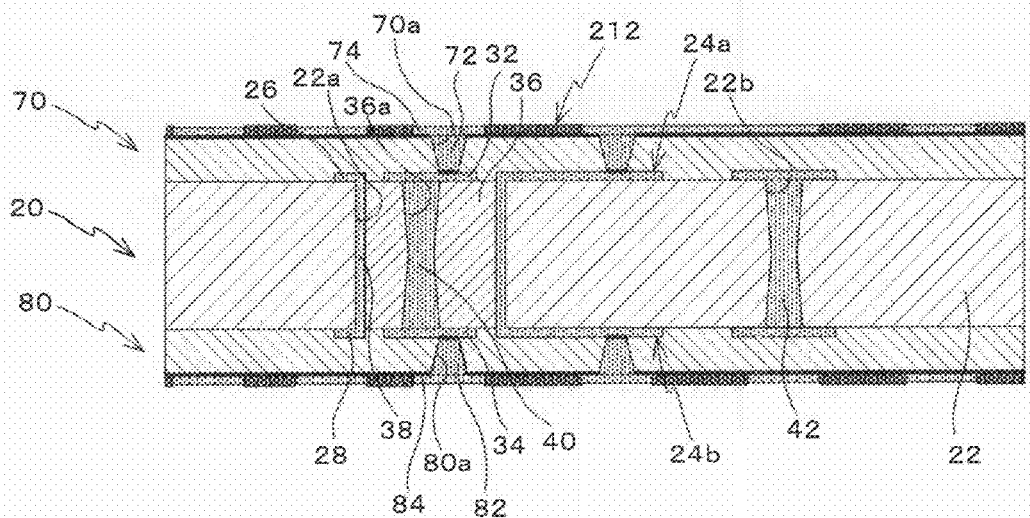

Then, after the substrate is washed with water and dried, electrolytic plating is performed. Accordingly, as shown in FIG. 6E, third conductive circuit 74, fourth conductive circuit 84 and the like are formed in the openings of plating resist layers 212. During that time, plating is filled in via holes (70a, 80a), and via conductors (72, 82) are formed.

At that time, via conductors (72, 82) are formed so that their centers "C" are shifted from center "A" of second through-hole conductor 40 in a direction indicated by arrow-X2.

Figure 6F:
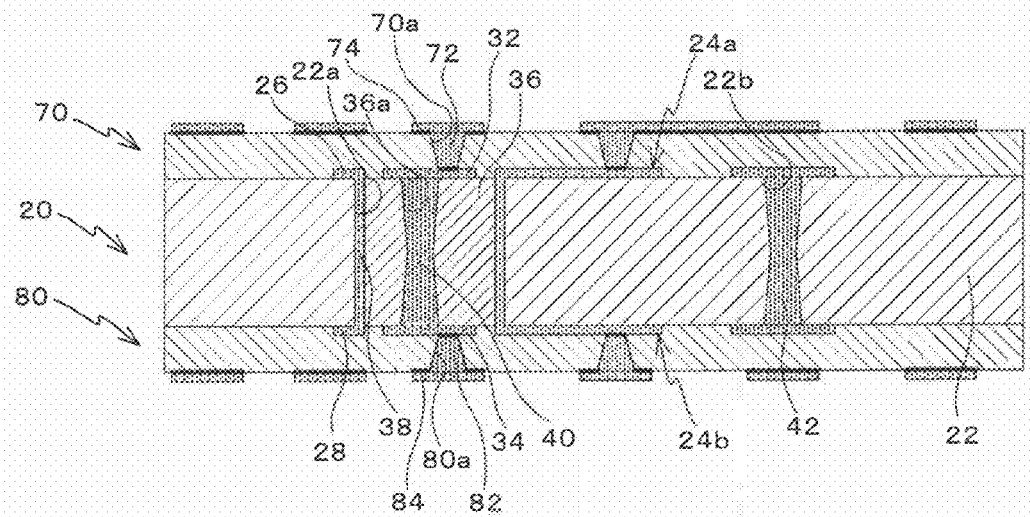

Next, plating resist layers 212 are removed, and the substrate is washed with water and dried. Then, exposed portions of electroless plated film 210 are removed by etching. Accordingly, as shown in FIG. 6F, the substrate is obtained where insulation layers (70, 80) are laminated.

Figure 6G:
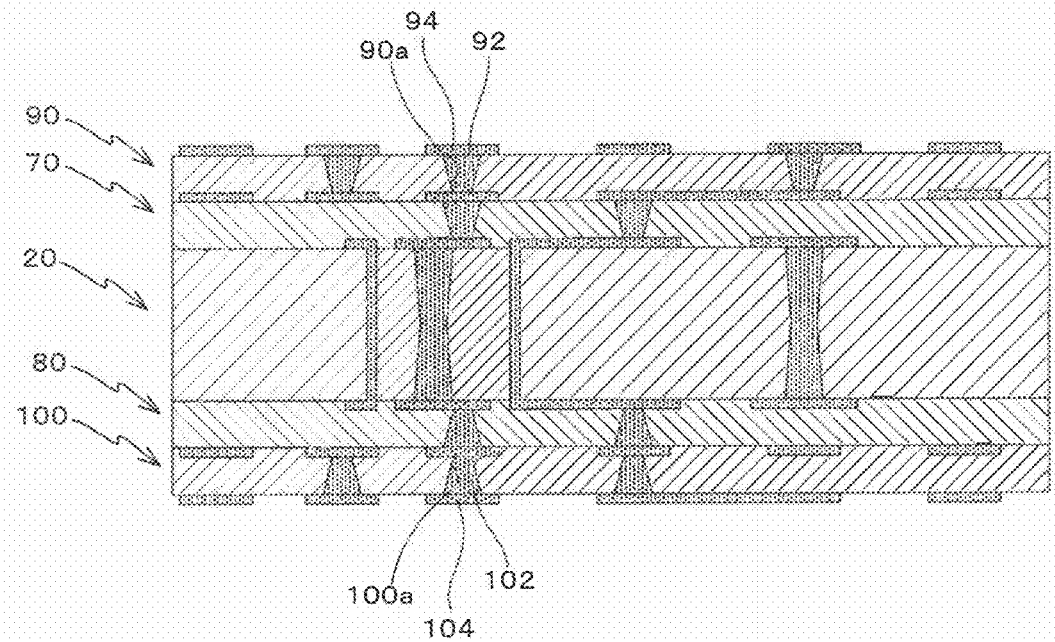
Figure 6H:
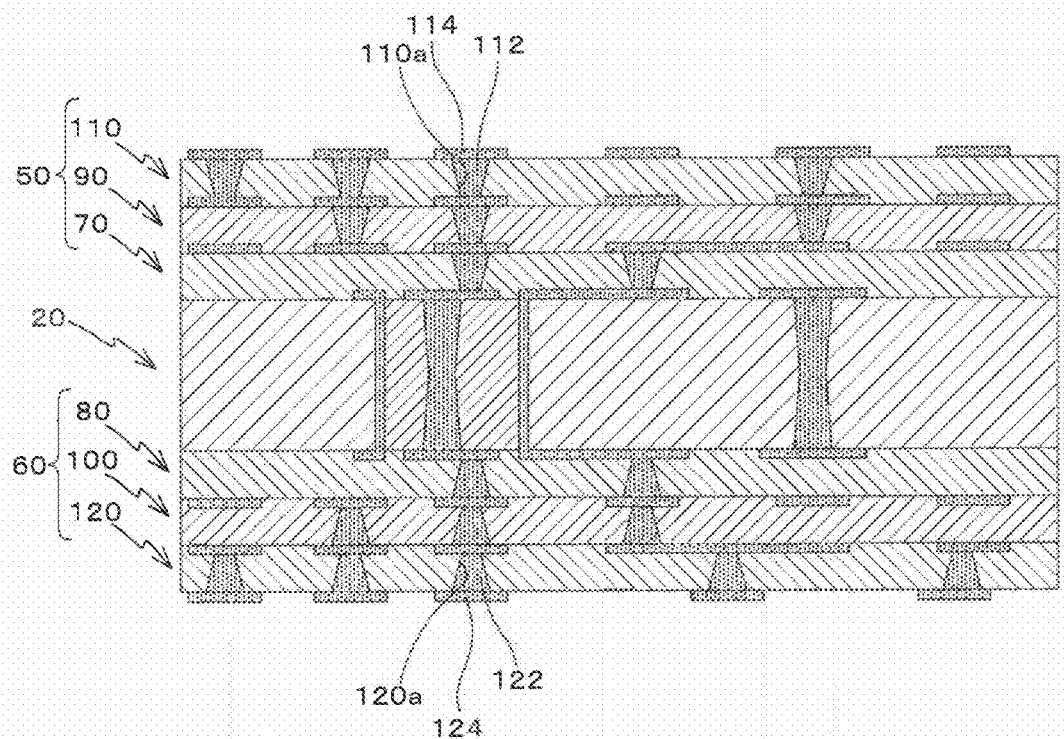

Then, by repeating the above procedures, insulation layers (90, 100, 110, 120) are formed as shown in FIGS. 6G and 6H. Accordingly, built-up layers (50, 60) are formed on core substrate 20.

Forming Solder-Resist Layer 130 and Solder-Resist Layer 140

Next, liquid or dry-film-type photosensitive resist (solder resist) is applied or laminated on both surfaces of the substrate shown in FIG. 6H, and solder-resist layers (130, 140) are formed as shown in FIG. 7A.

Then, photomask film having opening portions is adhered to the surfaces of solder-resist layers (130, 140), which are then exposed to ultraviolet rays and developed in an alkaline solution. As a result, as shown in FIG. 7B, opening portions (130a, 140a) to expose portions which become solder pads are formed in solder-resist layers (130, 140).

Surface Treatment

Figure 8A:
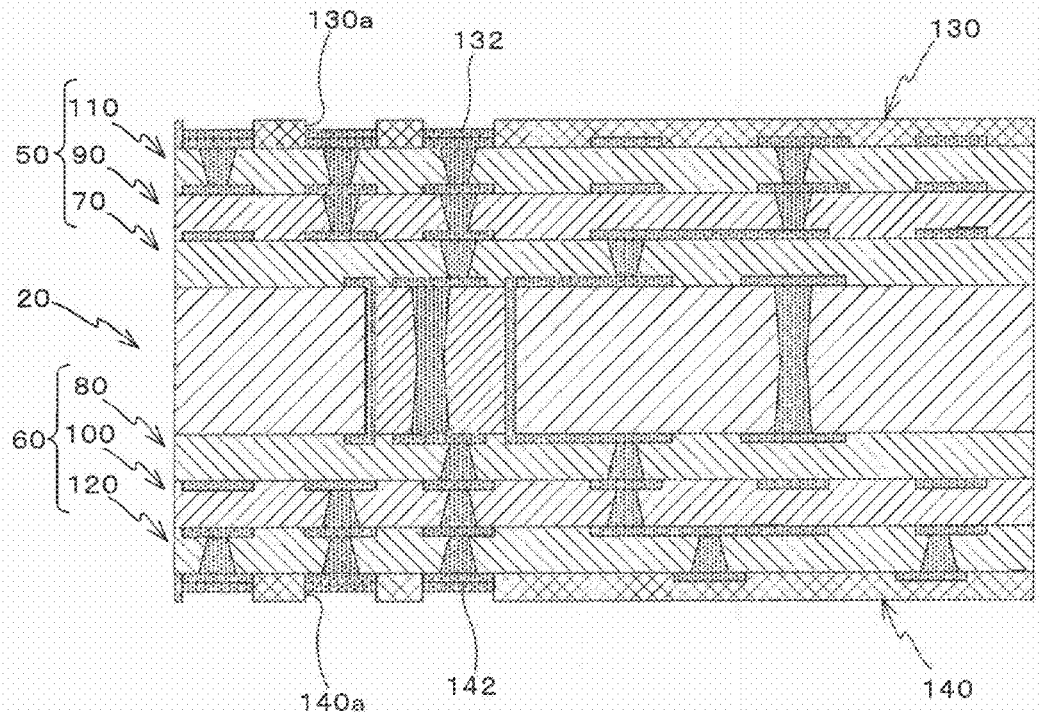
FIGS. 8A-8B are steps showing a surface treatment process.

Next, as shown in FIG. 8A, in opening portions (130a, 140a) solder connection layers (132, 142) made of a nickel-plated layer and a gold-plated layer are formed. The nickel-plated layer is formed by immersing the substrate in an electroless nickel plating solution, and the gold-plated layer is formed by immersing the substrate in an electroless gold plating solution.

Other than the above, solder connection layers (132, 142) may also be formed as triple-layer plated layers of nickel, palladium and gold. Alternatively, a single-plated layer of gold, silver, tin or the like may be formed, and a resin film of flux or the like may also be formed.

Figure 8B:
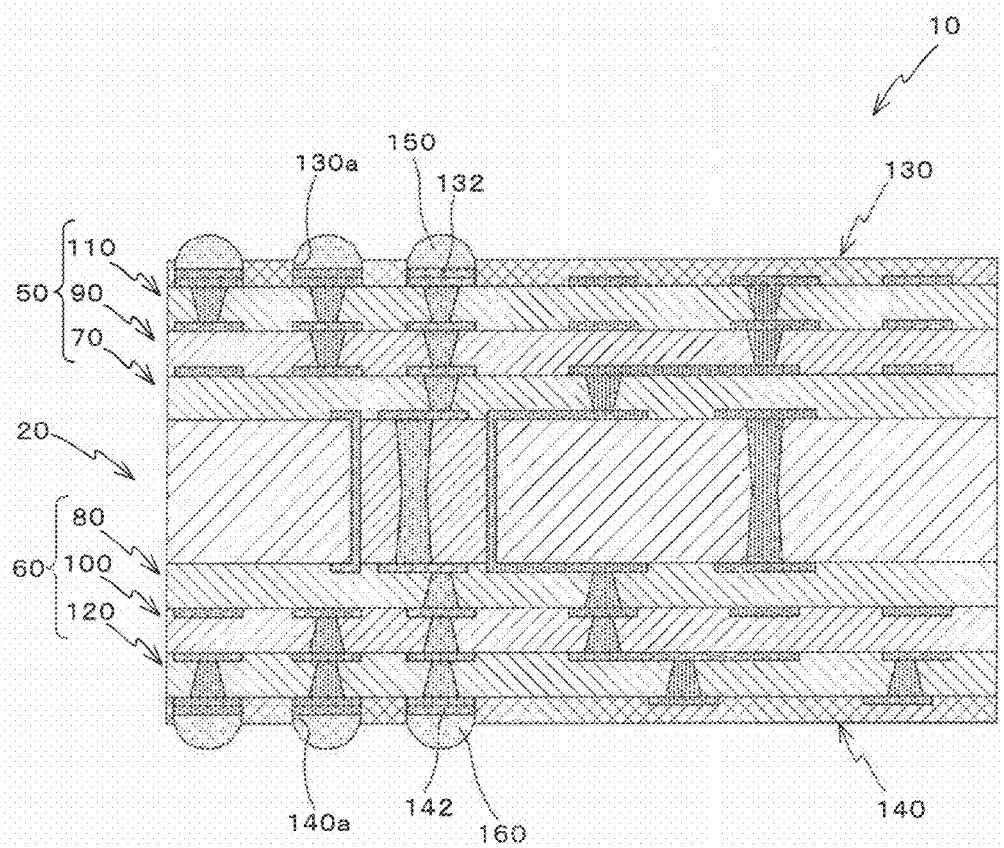

Next, as shown in FIG. 8B, by printing solder paste on solder connection layers (132, 142) and reflowing it, external connection terminals (150, 160) are formed. Accordingly, wiring board 10 is obtained. Wiring board 10 is connected to electronic components such as an IC chip using external connection terminals (150, 160).

In wiring board 10 formed as above, via conductors (72, 82) are formed in a position that is shifted from the center of inner through-hole conductor 40 in a direction indicated by arrow-X2 which is parallel to substrate 22. Accordingly, via conductors (72, 82) are connected not to inner through-hole conductor 40, but to relatively flat areas of conductive portions (32, 34).

Here, as described previously, the surfaces of the filler become curved when the filler is cured. Moreover, when inner through-hole conductor 40 is formed by filling plating in second penetrating hole (36*a*), it is assumed that the greater the aspect ratio of the second penetrating hole, the more likely recessed portions occur on the surfaces of a through-hole conductor (conductive portion). In such a case, if via conductors are formed directly on inner through-hole conductor 40, it is difficult to ensure the connection reliability of via conductors to the conductive portions due to the surface features of the filler and through-hole conductor (conductive portion). However, in the present embodiment, since via conductors (72, 82) are connected to relatively flat areas of conductive portions (32, 34), connection reliability is enhanced between inner through-hole conductor 40 and via conductors (72, 82).

In addition, in the present embodiment, an outer through-hole conductor and an inner through-hole conductor form a coaxial structure. Thus, by using the outer through-hole conductor and the inner through-hole conductor as power-supply transmission routes, the impedance of the transmission routes is reduced.

In such a case, the magnetic field generated by the electric current flowing through the outer through-hole conductor and the magnetic field generated by the electric current flowing through the inner through-hole conductor are offset. As a result, the leakage of magnetic flux to the area surrounding the outer through-hole conductor decreases, and noise that contaminates the signal lines of wiring board 10 is reduced.

Also, in the present embodiment, by forming VRM inductors in a wiring board so as to install a VRM in the wiring board, supplying voltage for a CPU is achieved without loss. Accordingly, the number of chip capacitors required to supply power at a constant voltage is reduced.

Figure 9:
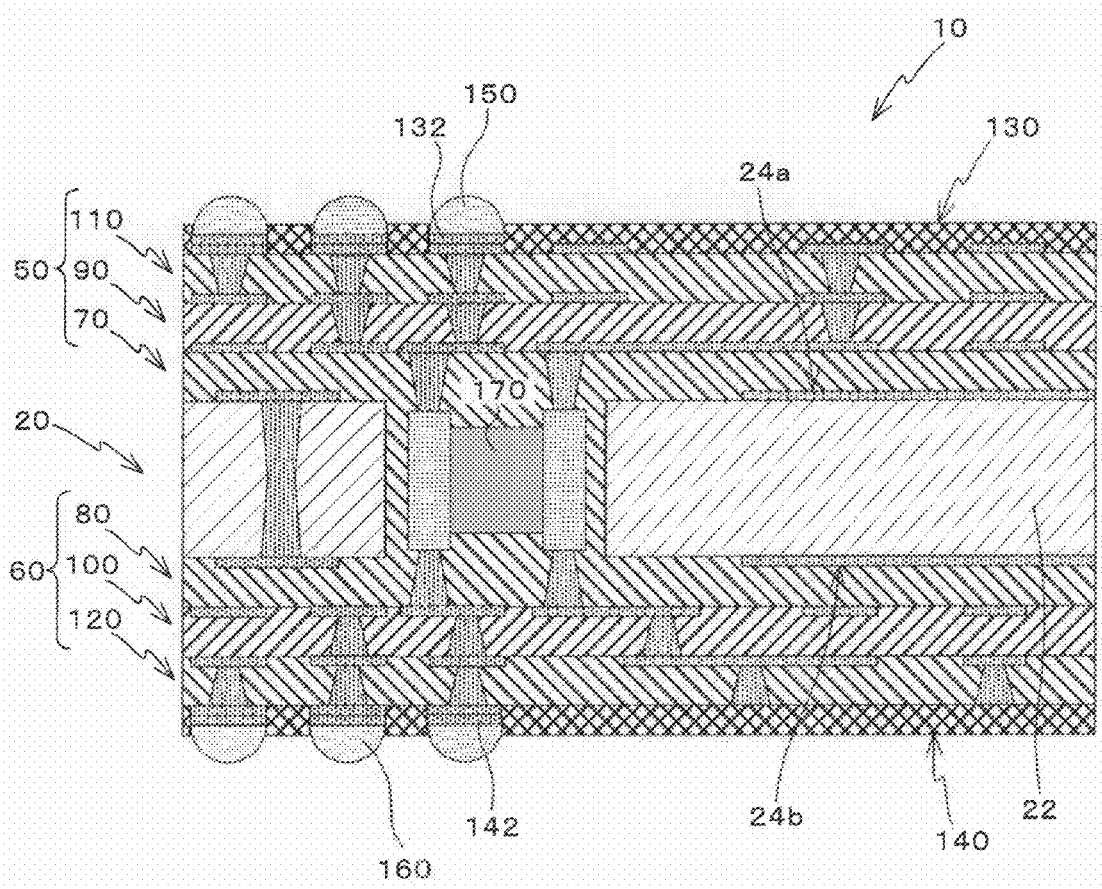
FIG. 9 is a cross-sectional view showing a wiring board according to a modified example (1)
Figure 10:
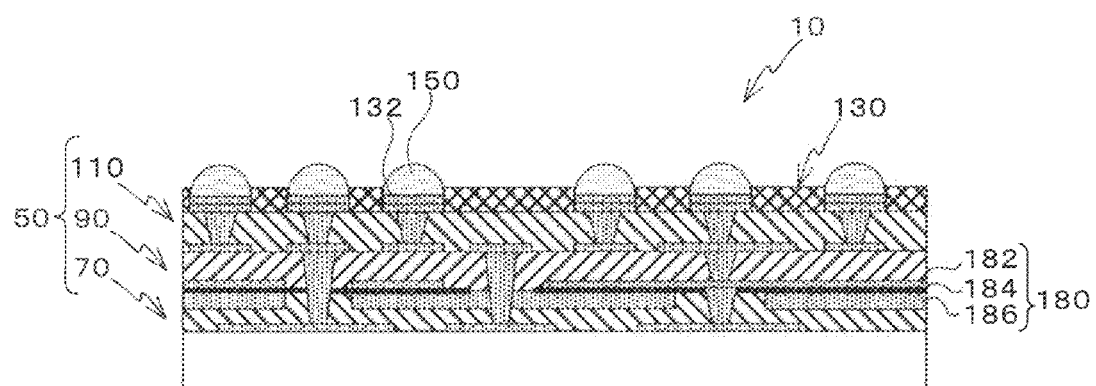
FIG. 10 is a cross-sectional view showing a wiring board according to a modified example (2)

Moreover, a capacitor required for a VRM may be arranged in a wiring board. For example, as shown in FIG. 9, chip capacitor 170 may be formed in insulative substrate 22. Furthermore, as shown in FIG. 10, thin-film capacitor 180 may also be formed on an insulation layer. Such thin-film capacitor 180 is made of a pair of electrodes (182, 186) facing each other and ceramic dielectric layer 184 sandwiched between them.

First conductive circuit 26 and conductive portion 32 are positioned on substantially the same plane, and second conductive circuit 28 and conductive portion 34 are positioned on substantially the same plane. Therefore, second penetrating hole (36*a*) formed in filler 36 has the minimal length required to form a coaxial structure. Accordingly, excellent results are ensured when filling plating in second penetrating hole (36*a*). Thus, when inner through-hole conductor 40 is formed, plating may be filled without voids in second penetrating hole (36*a*).

A wiring board according to the present invention is not limited to the above embodiment, and various modifications may be made within a scope that does not deviate from the gist of the invention.

For example, in the above embodiment, the diameter in the central portion of inner through-hole conductor 40 and third through-hole conductor 42 is set smaller than the diameter in the upper and lower end portions. However, inner through-hole conductor 40 and third through-hole conductor 42 are not limited to such, and they may be formed to be a truncated cone where either diameter in the upper end portion or in the lower end portion is set greater than the other. Alternatively, inner through-hole conductor 40 and third through-hole conductor 42 may be formed to be a perfect cylinder.

The above embodiment has been described on the basis that via conductors are filled vias. However, via conductors are not limited to such, and they may also be conformal vias.

In the above embodiment, the opening shapes of first penetrating hole (22*a*), second penetrating hole (36*a*) and third penetrating hole (22*b*) are circular. However, they are not limited to such, and may be oval or polygonal.

Figure 11A:
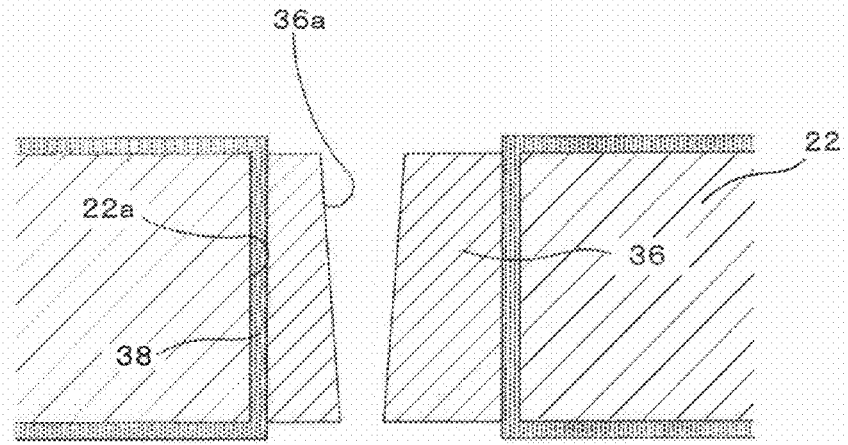
FIG. 11A is a cross-sectional view showing a wiring board according to a modified example (3)
Figure 11B:
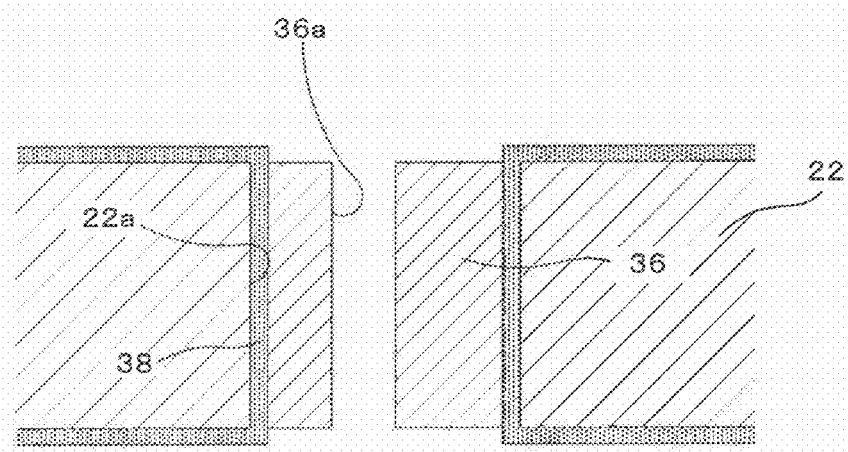
FIG. 11B is a cross-sectional view showing a wiring board according to a modified example (4).

Also, the inner diameter of the central portion of second penetrating hole (36*a*) and third penetrating hole (22*b*) is set smaller than the inner diameter in the upper and lower ends. As shown in FIG. 11A, second penetrating hole (36*a*) and third penetrating hole (22*b*) may have a smaller inner diameter in the upper-end opening than in the lower-end opening. Alternatively, as shown in FIG. 11B, the wall surface of second penetrating hole (36*a*) and third penetrating hole (22*b*) may be set perpendicular to the first and second surfaces of substrate 22.

Also, in wiring board 10 of the above embodiment, conductive portions (32, 34) are made as lands. However, they may be formed as via conductors (72, 82). In such a case, there is no land, and via conductors (72, 82) are directly connected to inner through-hole conductor 40.

Alternatively, the thicknesses of first conductive circuit 26 and second conductive circuit 28 may be set substantially the same as the thickness of conductive portions (32, 34). Yet alternatively, first conductive circuit 26 and second conductive circuit 28 may be set thinner than conductive portions (32, 34). In such a case, for example, after plated films 208 are formed, it is an option for conductive layers which form first conductive circuit 26 and second conductive circuit 28 to be made thinner by etching.

In the above embodiment, second penetrating hole (36*a*) and third penetrating hole (22*b*) are formed by laser. However, second penetrating hole (36*a*) and third penetrating hole (22*b*) may be formed by a drill or the like.

In the above embodiment, the layers are patterned using a tenting method. However, the method is not limited to such, and the layers may also be patterned using other methods, such as a semi-additive method or a subtractive method.

In wiring board 10 of the above embodiment, built-up layer 50 formed on a surface of core substrate 20 has three insulation layers (70, 90, 100), and built-up layer 60 has three insulation layers (80, 100, 120). However, built-up layers (50, 60) are not limited to such, and they may have four or more insulation layers. The number of layers in built-up layers (50, 60) may be determined properly according to usage requirements or the like for wiring board 10.

External connection terminals to be connected to electronic components may only be formed on either main surface of wiring board 10.

A wiring board according to one aspect of the present invention has the following: a substrate having a first surface and a second surface and a first penetrating hole; a first conductive circuit formed on the first surface of the substrate; a second conductive circuit formed on the second surface of the substrate; a first through-hole conductor connecting the first conductive circuit and the second conductive circuit and formed on the inner wall of the first penetrating hole; a filler filled inside the first through-hole conductor and having a second penetrating hole; a second through-hole conductor formed in the second penetrating hole; an interlayer insulation layer formed on the substrate; a third conductive circuit formed on the interlayer insulation layer; and a via conductor formed in the interlayer insulation layer and electrically connecting the third conductive circuit and the second through-hole conductor. In such a wiring board, the second through-hole conductor is formed with a conductive material filled in the second penetrating hole, and the via conductor is shifted from the center of the second through-hole conductor in a direction parallel to the first surface of the substrate.

A method for manufacturing a wiring board according to another aspect of the present invention includes the following: forming a first penetrating hole in a substrate having a first surface and a second surface; forming a first through-hole conductor on the inner wall of the first penetrating hole; on the first surface and the second surface of the substrate, forming conductive circuits to be connected by the first through-hole conductor; filling a filler inside the first through-hole conductor; forming a second penetrating hole in the filler; forming a second through-hole conductor by filling a conductive material in the second penetrating hole; forming an interlayer insulation layer on the substrate; forming a third conductive circuit on the interlayer insulation layer; and forming a via conductor in the interlayer insulation layer to connect the second through-hole conductor and the third conductive circuit. In such a manufacturing method, the via conductor is formed in a position shifted from the center of the second through-hole conductor in a direction parallel to the first surface of the substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a substrate;
   a first wiring layer formed on a first surface of the substrate and including a first conductive circuit and a first conductive portion;
   a second wiring layer formed on a second surface of the substrate on an opposite side with respect to the first surface and including a second conductive circuit;
   an interlayer insulation layer formed on the substrate and the first wiring layer; and
   a third conductive circuit formed on the interlayer insulation layer,
   wherein the substrate has a first penetrating hole and a first through-hole conductor connecting the first conductive circuit and the second conductive circuit and formed on an inner wall of the first penetrating hole, the substrate has a filler portion filling inside the first through-hole conductor, a second penetrating hole penetrating through the filler portion inside the first through-hole conductor, and a second through-hole conductor formed in the second penetrating hole, the first conductive portion is formed on the filler portion of the first surface of the substrate and connected to a first end of the second through-hole conductor, the second through-hole conductor comprises a conductive material filling the second penetrating hole, the interlayer insulation layer has a via conductor formed in the interlayer insulation layer and connecting the third conductive circuit and the first conductive portion such that the third conductive circuit is connected to the second through-hole conductor, and the via conductor is positioned such that the via conductor is shifted from the center of the second through-hole conductor in a direction parallel to the first surface of the substrate.

2. The wiring board according to claim 1, wherein the conductive material is made of a copper plating.

3. The wiring board according to claim 1, wherein the filler portion is made of a resin.

4. The wiring board according to claim 1, wherein the second wiring layer includes a second conductive portion formed on the filler portion of the second surface of the substrate and connected to a second end of the second through-hole conductor on an opposite side of the first end.

5. The wiring board according to claim 4, wherein the first and second conductive portions have a diameter which is set greater than a diameter of the second through-hole conductor.

6. The wiring board according to claim 1, wherein the first through-hole conductor and the second through-hole conductor are circuited such that a direction of electric current in the first through-hole conductor is different from a direction of electric current in the second through-hole conductor.

7. The wiring board according to claim 1, wherein the second penetrating hole is formed by conducting laser irradiation.

8. The wiring board according to claim 1, wherein the second through-hole conductor is positioned such that the second through-hole conductor is shifted from the center of the first penetrating hole in a first direction parallel to the first surface of the substrate, and the via conductor is positioned such that the via conductor is shifted from the second through-hole conductor in a second direction different from the first direction.

9. The wiring board according to claim 1, wherein the first through-hole conductor and the second through-hole conductor form power-supply through-hole conductors.

10. The wiring board according to claim 1, wherein the substrate has a third penetrating hole and a third through-hole conductor formed in the third penetrating hole, and the third through-hole conductor is connecting the first conductive circuit and the second conductive circuit.

11. The wiring board according to claim 10, wherein the third through-hole conductor forms a signal through-hole conductor.

12. The wiring board according to claim 1, wherein the conductive material is made of a copper plating, and the second wiring layer includes a second conductive portion formed on the filler portion of the second surface of the substrate and connected to a second end of the second through-hole conductor on an opposite side of the first end.

13. The wiring board according to claim 1, wherein the first conductive portion has a diameter which is set greater than a diameter of the second through-hole conductor.

14. The wiring board according to claim 1, wherein the first wiring layer comprises a plated layer, and the second wiring layer comprises a plated layer.

15. The wiring board according to claim 1, wherein the second wiring layer includes a second conductive portion formed on the filler portion of the second surface of the substrate and connected to a second end of the second through-hole conductor on an opposite side of the first end, and the first through-hole conductor and the second through-hole conductor are circuited such that a direction of electric current in the first through-hole conductor is different from a direction of electric current in the second through-hole conductor.

16. The wiring board according to claim 1, wherein the second wiring layer includes a second conductive portion formed on the filler portion of the second surface of the substrate and connected to a second end of the second through-hole conductor on an opposite side of the first end, the first and second conductive portions have a diameter which is set greater than a diameter of the second through-hole conductor, and the first through-hole conductor and the second through-hole conductor are circuited such that a direction of electric current in the first through-hole conductor is different from a direction of electric current in the second through-hole conductor.

17. The wiring board according to claim 1, further comprising a first built-up layer formed on the first surface of the substrate and including the interlayer insulation layer and the third conductive circuit.

18. The wiring board according to claim 1, further comprising a first built-up layer formed on the first surface of the substrate and including the interlayer insulation layer and the third conductive circuit, wherein the second wiring layer includes a second conductive portion formed on the filler portion of the second surface of the substrate and connected to a second end of the second through-hole conductor on an opposite side of the first end, the first and second conductive portions have a diameter which is set greater than a diameter of the second through-hole conductor, and the first through-hole conductor and the second through-hole conductor are circuited such that a direction of electric current in the first through-hole conductor is different from a direction of electric current in the second through-hole conductor.

19. The wiring board according to claim 1, further comprising:
a first built-up layer formed on the first surface of the substrate and including the interlayer insulation layer and the third conductive circuit; and
a second built-up layer formed on the second surface of the substrate.

20. The wiring board according to claim 1, further comprising:
a first built-up layer formed on the first surface of the substrate and including the interlayer insulation layer and the third conductive circuit; and
a second built-up layer formed on the second surface of the substrate,
wherein the second wiring layer includes a second conductive portion formed on the filler portion of the second surface of the substrate and connected to a second end of the second through-hole conductor on an opposite side of the first end, the first and second conductive portions have a diameter which is set greater than a diameter of the second through-hole conductor, and the first through-hole conductor and the second through-hole conductor are circuited such that a direction of electric current in the first through-hole conductor is different from a direction of electric current in the second through-hole conductor.

* * * * *